(12) United States Patent
Griffin et al.

(10) Patent No.: US 8,963,744 B2
(45) Date of Patent: Feb. 24, 2015

(54) KEY SYSTEM FOR AN ELECTRONIC DEVICE

(75) Inventors: Jason Griffin, Kitchener (CA); Roman Rak, Waterloo (CA); Steven Fyke, Waterloo (CA); Norman Ladouceur, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 1584 days.

(21) Appl. No.: 12/116,455

(22) Filed: May 7, 2008

(65) Prior Publication Data

US 2008/0211696 A1 Sep. 4, 2008

Related U.S. Application Data

(63) Continuation of application No. 11/129,404, filed on May 16, 2005, now Pat. No. 7,385,530.

(51) Int. Cl.
*H03M 11/00* (2006.01)
*H01H 13/84* (2006.01)

(52) U.S. Cl.
CPC ......... *H01H 13/84* (2013.01); *H01H 2213/002* (2013.01); *H01H 2215/03* (2013.01); *H01H 2215/034* (2013.01); *H01H 2215/048* (2013.01); *H01H 2217/006* (2013.01); *H01H 2217/014* (2013.01); *H01H 2217/032* (2013.01); *H01H 2225/018* (2013.01); *H01H 2235/002* (2013.01); *H01H 2239/048* (2013.01); *H01H 2300/038* (2013.01); *H03K 2217/96062* (2013.01)
USPC ........... 341/22; 345/161; 400/485; 400/491.3

(58) Field of Classification Search
CPC ....... G06F 3/016; G06F 3/0202; G06F 3/041; G09B 21/003
USPC ........... 341/20, 22, 27, 34; 345/161; 400/485, 400/491.3
See application file for complete search history.

(56) References Cited

U.S. PATENT DOCUMENTS

| 4,185,169 A | * | 1/1980 | Tanimoto et al. ............. 704/270 |
| 4,733,590 A | | 3/1988 | Watanabe |
| 4,818,828 A | | 4/1989 | Curley et al. |
| 4,831,218 A | | 5/1989 | Wright |

(Continued)

FOREIGN PATENT DOCUMENTS

| DE | 10103563 | 8/2002 |
| EP | 0005175 A1 | 11/1979 |

(Continued)

*Primary Examiner* — Albert Wong
(74) *Attorney, Agent, or Firm* — Hanley, Flight & Zimmerman, LLC (57) ABSTRACT

A key activation system for use in an electronic device is provided. The system comprises an activation mechanism associated with a key in the system, a first feedback system and a second feedback system. The activation mechanism is associated with the key activation system and provides a first feedback sense when the activation mechanism has triggered the first activation condition. The second feedback system provides a second feedback sense indicating when the key triggers the second activation condition. In the system, the second feedback system operates independently from the activation mechanism and the first activation condition is triggered before the second activation condition when the activation mechanism is initially engaged. An activation mechanism may be centrally located for a set of keys.

4 Claims, 8 Drawing Sheets

(56) References Cited

U.S. PATENT DOCUMENTS

| | | |
|---|---|---|
| 5,121,091 A | 6/1992 | Fujiyama |
| 5,311,175 A | 5/1994 | Waldman |
| 5,434,566 A | 7/1995 | Iwasa |
| 5,675,329 A | 10/1997 | Barker |
| 6,208,271 B1 | 3/2001 | Armstrong |
| 6,215,417 B1 | 4/2001 | Krass et al. |
| 6,310,606 B1 | 10/2001 | Armstrong |
| 6,563,415 B2 | 5/2003 | Armstrong |
| 6,680,677 B1 | 1/2004 | Tiphane |
| 6,758,615 B2 | 7/2004 | Monney et al. |
| 7,420,480 B2 * | 9/2008 | Morris ............................ 341/27 |
| 7,460,050 B2 * | 12/2008 | Alvarado et al. ............. 341/176 |
| 2002/0166754 A1 | 11/2002 | Ohba et al. |
| 2003/0038776 A1 | 2/2003 | Rosenberg |
| 2004/0256203 A1 | 12/2004 | Pihlaja |

FOREIGN PATENT DOCUMENTS

| | | |
|---|---|---|
| EP | 0059378 | 9/1982 |
| EP | 0095585 A2 | 12/1983 |
| EP | 0222708 | 5/1987 |
| EP | 1003188 | 5/2000 |
| EP | 1727173 A1 | 11/2006 |
| GB | 1469800 A | 4/1977 |
| GB | 2124031 | 2/1984 |
| GB | 2168004 A | 6/1986 |
| GB | 2174844 | 11/1986 |

* cited by examiner

KEY SYSTEM FOR AN ELECTRONIC DEVICE

RELATED APPLICATION

This application is a U.S. continuation application of U.S. patent application Ser. No. 11/129,404 filed on May 16, 2005 now U.S. Pat. No. 7385530.

FIELD OF THE DISCLOSURE

The disclosure described herein relates to a key system providing an input device in an electronic device, such as a handheld electronic device. In particular, the disclosure relates to a system and method for implementing a key in a keypad in the device and providing appropriate feedback to the user to acknowledge activation of the key.

BACKGROUND

A conventional handheld electronic device, such as a Personal Digital Assistant (PDA) and a wireless telephone, includes a keyboard/keypad, a display and a system printed circuit board (PCB) disposed within a common housing. The display is typically provided as a reflective, transmissive or transreflective LCD display panel.

In a typical keypad, aural and tactile feedback is provided to the user as he presses onto a key in the keypad, usually as an audible "click" and a positive movement of the depressed key. One known method of generating the audible feedback is to insert a separate, compressible dome in the keypad assembly which compresses and temporarily collapses as sufficient downward pressure in exerted against the dome by an element in the keypad assembly. The dome assembly is also used to complete an electrical circuit associated with the key.

Although the use of a separate dome in a keypad assembly is effective in providing feedback to the user, its use in an electrical circuit affects the cost of the build of materials for the device.

There is a need for an alternative key system which operates as a traditional key and provides feedback to a user.

BRIEF DESCRIPTION OF THE DRAWINGS

The disclosure and related embodiments will now be described, by way of example only, with reference to the accompanying drawings, in which.

DETAILED DESCRIPTION OF EMBODIMENTS

The description which follows, and the embodiments described therein, are provided by way of illustration of an example, or examples, of particular embodiments of the principles of the present disclosure. These examples are provided for the purposes of explanation, and not limitation, of those principles and of the disclosure. In the description, which follows, like parts are marked throughout the specification and the drawings with the same respective reference numerals.

In a first aspect, a key activation system for use in a handheld communication device is provided. The system comprises an activation mechanism associated with a key in the system, a first feedback system and a second feedback system. The activation mechanism is associated with the key activation system and provides a first feedback sense when the activation mechanism has triggered the first activation condition. The second feedback system provides a second feedback sense indicating when the key triggers the second activation condition. In the system, the second feedback system operates independently from the activation mechanism. Also the first activation condition is triggered before the second activation condition when the activation mechanism is initially engaged.

In the system, the first feedback system may generate a feedback sense which is one of a motion, audible and visual signal and the second feedback system may utilize at least one of a deflection or compression of a component on the key.

In the system, the key may have selectable values associated with it, the feedback system may have different feedback senses associated with it and the feedback system may utilize one of the feedback senses depending on what value is currently associated with the key.

In the system, the activation mechanism may be selected from an accelerometer, a piezoelectric circuit and a strain gauge.

In the system, the second feedback system may include a collapsible dome located on an upper portion of an element in the key.

In the system, the second feedback system may include a cam element which interacts with a cam surface on a stalk of the key to provide feedback.

In a second aspect, a keypad system for use in a handheld communication device is provided. The system comprises keys, a central activation sensor, and a feedback system. The keys have at least first and second activation conditions. The sensor detects any of the first and second activation conditions from the keys. The feedback system provides feedback senses in response to any activation conditions of a key.

In the system, the feedback system may be a vibration module and the activation sensor may be an accelerometer.

In the system, a set of keys in the keys may have selectable values associated with it. The feedback system has different feedback senses associated with it and the feedback system utilizes a feedback sense depending on which selectable value is currently associated with a key in the set of keys.

In the system, the set of keys may represent a numeric keypad and one of the feedback senses may indicate that one key in the set of keys is being selected as a number digit. Alternatively, in the system, the set of keys may represent a yes and a no response to a query and one of the feedback senses may indicate that one key in the set is being selected as either the yes or the no response.

In other aspects various combinations of sets and subsets of the above aspects are provided.

For convenience of presentation only, the description of embodiments is provided in three general sections: a first section describing basic elements of a device incorporating the embodiments, including a key assembly; a second section describing elements relating to a pre-select system for a key assembly; and a third section describing elements relating to a centralized detection system for key assemblies. It will be appreciated that embodiments may incorporate aspects across one or more sections. Each section is described in turn.

Figure 1:
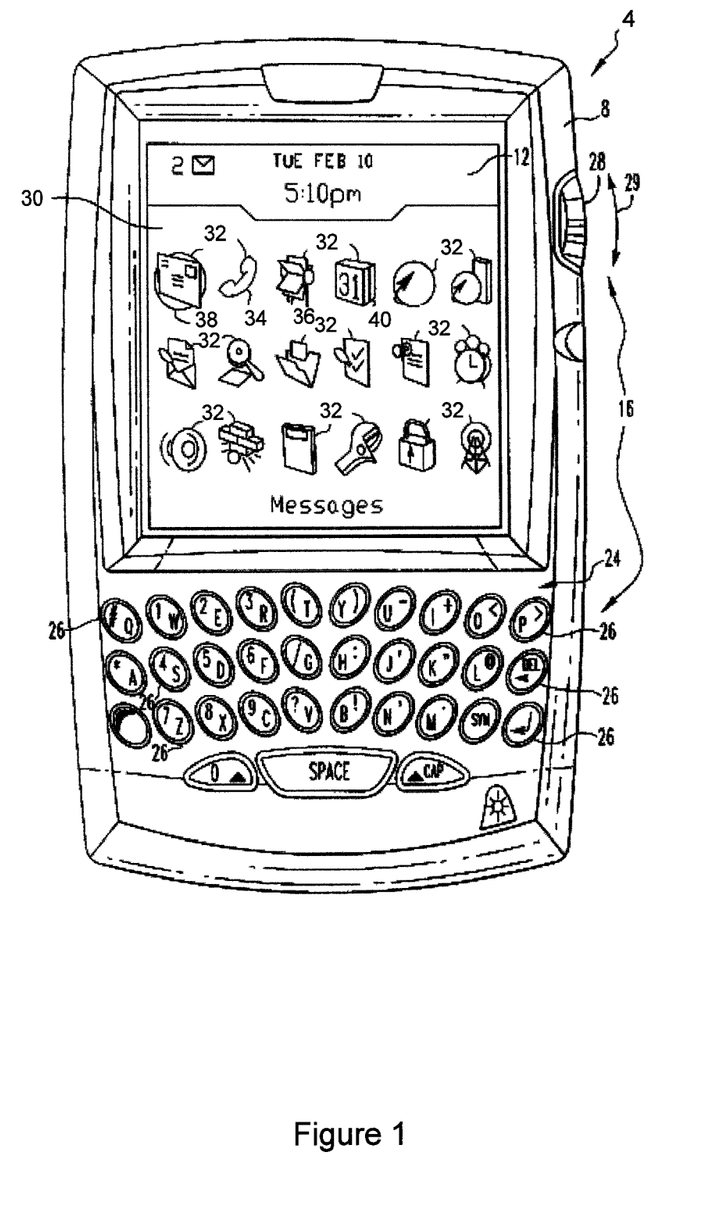
FIG. 1 is a top plan view of a handheld electronic device which implements at least one embodiment described herein.
Figure 2:
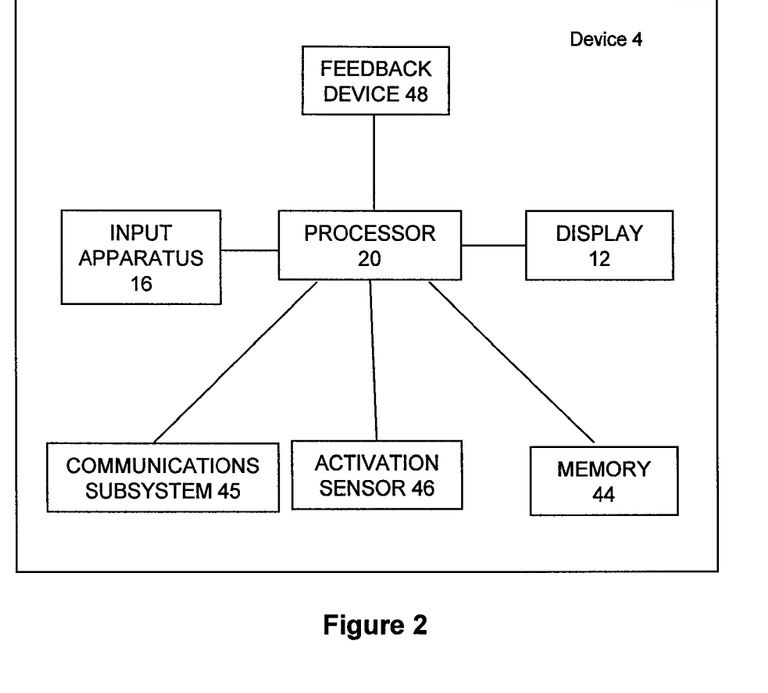
FIG. 2 is a schematic view depicting functional details of the handheld electronic device of FIG. 1, including a keypad, a microprocessor, a feedback sensor and a motion sensor.

For the first section, a handheld electronic device 4 in accordance with an embodiment is depicted generally in FIGS. 1 and 2. The handheld electronic device 4 includes a housing 8, a display 12, an input apparatus 16, and a processor 20 (FIG. 2) which may be, without limitation, a microprocessor. The processor 20 is responsive to inputs received from the input apparatus 16 and provides outputs to the display 12. Examples of handheld electronic devices are included in U.S. Pat. Nos. 6,452,588 and 6,489,950, which are incorporated by reference herein.

As can be understood from FIG. 1, the input apparatus 16 includes a keyboard 24 having a plurality of keys 26, and a rotatable thumbwheel 28. As used herein, the expression "key" and variations thereof shall refer broadly to any of a variety of input devices such as buttons, switches, and the like without limitation. The keys 26 and the rotatable thumbwheel 28 are input devices of the input apparatus 16, and each of the input members has a function assigned thereto. As used herein, the expression "function" and variations thereof can refer to any type of process, task, procedure, routine, subroutine, function call, or other type of software or firmware operation that can be performed by the processor 20 of the handheld electronic device 4.

As is shown in FIG. 2, the processor 20 is in electronic communication with memory 44. Memory 44 can be any of a variety of types of internal and/or external storage media such as, without limitation, RAM, ROM, EPROM(s), EEPROM (s), and the like, alone or in combination, that provide a storage register for data storage such as in the fashion of an internal storage area of a computer, and can be volatile memory or nonvolatile memory. The memory 44 further includes a number of routines executable by processor 20 for the processing of data. The routines can be in any of a variety of forms such as, without limitation, software, firmware, and the like, and shall include one or more subroutines, processes, procedures, function calls or the like, alone or in combination. As is typical in the art, all or most of the components are mounted on a printed circuit board (PCB) which can be contained within housing 8.

As is also shown in FIG. 2, processor 20 is in electronic communication with communications subsystem 45. Communications functions for handheld electronic device 4, including data and voice communications (e.g. wireless or telephone), are performed through communications subsystem 45. Communications subsystem 45 includes a transmitter and a receiver (possibly combined in a single transceiver component), a SIM card, and one or more antennas. Other known components, such as a digital signal processor and a local oscillator, may also be part of communications subsystem 45. The specific design and implementation of communications subsystem 45 is dependent upon the communications network in which handheld electronic device 4 is intended to operate. For example, handheld electronic device 4 may include a communications subsystem 45 designed to operate with the Mobitex™, DataTAC™ or General Packet Radio Service (GPRS) mobile data communication networks and also designed to operate with any of a variety of voice communications networks, such as AMPS, TDMA, CDMA, PCS, GSM, and other suitable networks. Other types of data and voice networks, both separate and integrated, may also be utilized with handheld electronic device 4.

Also, device 4 includes an activation sensor 46 and a feedback device 48. Activation sensor 46 detects motion or activation of a key and is used to initiate a signal associated with stages of activation of the key. It may be implemented as a mechanical switch, an electrical switch, an accelerometer, a strain gauge, a piezoelectric circuit a touchscreen system, microphone or any other motion detection device known in the art. Feedback device 48 provides feedback to the user of device 4 when the key is depressed. Feedback may be provided through an audible signal, a tactile signal or a visual signal. An audible signal may be provided via a beeping module; a tactile signal may be provided through a vibration module; and a visual signal may be provided through a LED. Other feedback signals may be generated by other feedback devices.

In FIG. 1, the display 12 is depicted as displaying a home screen 30 that includes a number of applications depicted as discrete icons 32, including, without limitation, an icon representing a phone application 34, an address book application 36, a messaging application 38 which includes email, SMS and MMS applications, and a calendar application 40. In FIG. 1, the home screen 30 is currently active and its generation would typically be controlled by an application operating on device 4. Other applications, such as phone application 34, address book application 36, messaging application 38, and calendar application 40 can be initiated from the home screen 30 by providing an input through the input apparatus 16, such as by rotating the thumbwheel 28 and providing a selection input by translating the thumbwheel 28 in the direction indicated by the arrow 29 in FIG. 1.

Turning now to the second section, specific details on embodiments relating to key systems having pre-select and select functions. In particular, the embodiments provide feedback to a user when the key in the key system is initially depressed (but not yet activated), then subsequent activation of a command associated with the key if it is further depressed.

Figure 3A:
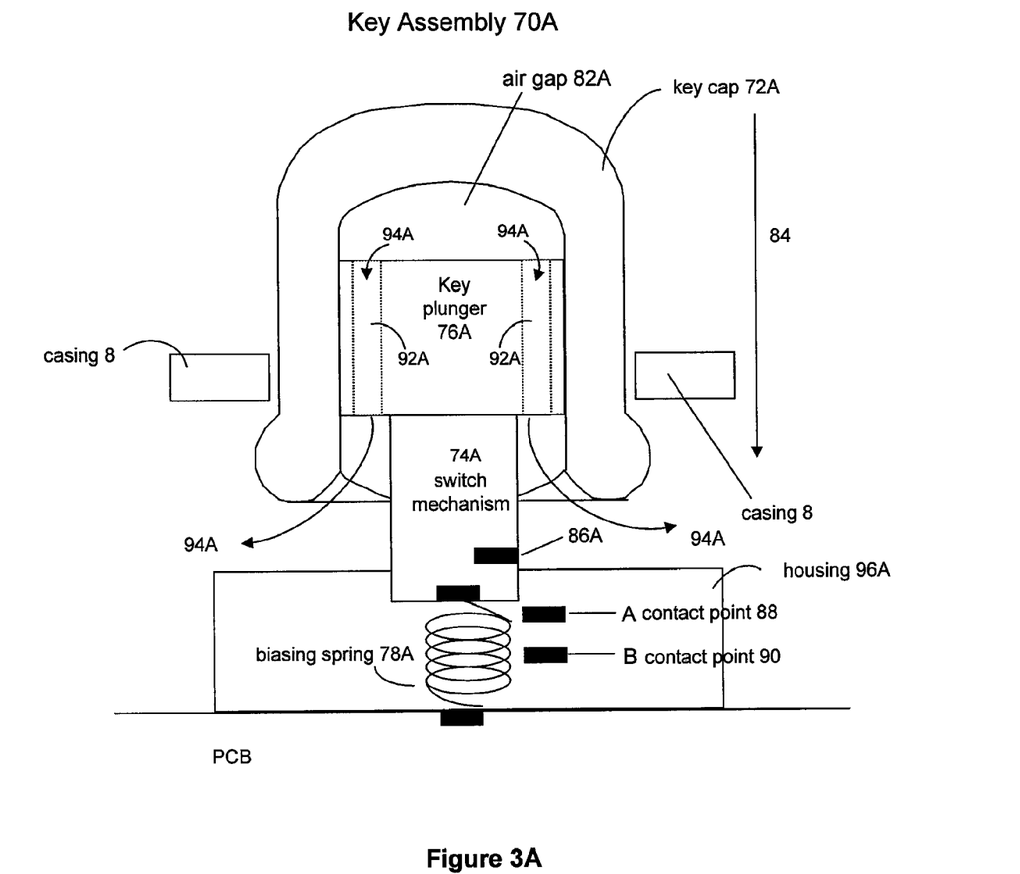
FIG. 3A is a side cross-sectional view of an embodiment of a keypad assembly which may be implemented in the device of FIG. 1.

Referring to FIG. 3A, in a first embodiment, key 26 (FIG. 1) is implemented as key assembly 70A. Key assembly 70A includes the following elements: key cap 72A, switch mechanism 74A, key plunger 76A and biasing spring 78A. Key cap 72A is generally the shape of an hollow upright cylinder having an open end on its bottom and a raised convex-shaped dome its top. Key cap 72A is positioned within an opening in casing 8, with a lower portion extending into casing 8 through an opening therein. Key cap 72A may have an exterior flange connected to its bottom edge to retain the lower portion within case 8. Key plunger 72A is dimensioned to fit snugly within key cap 72A. As such, key plunger 72A has a generally cylindrical body with a generally flat top. When key cap 72A is mated over key plunger 76A, air gap 82A is defined between the top surface of key plunger 76A and the bottom surface of the dome of key cap 72A. Key cap 72A is made of a thin and relatively flexible material such as a relatively thin plastic or metal.

Switch mechanism 74A is an activation sensor local to each key 26 which provides an indication of an activation state of the key assembly. The activation state can include at least a pre-select state and a select state.

Structurally, switch mechanism 74A is a cylindrical barrel having switch contacts thereon; it is attached to the bottom surface of key plunger 76A and has electrical contact area 86A on a side of its barrel. Biasing spring 78A is located between the bottom of switch mechanism 74A and the PCB of device 2. Biasing spring 78A provides a compressible element which biases switch mechanism 74A (and as such key cap 72A) upward. As key assembly 70A is depressed, biasing spring 78A imparts an incrementally increasing upward force to resist the downward force being imparted. Upon release of the key assembly 70A, biasing spring 78A forces the key cap 72A upward to its resting position. Although biasing spring 78A is shown as a coiled spring, in other embodiments it may be implemented as a leaf spring, a resilient puck (e.g. made from rubber or foam) or any other compressible, resilient mechanical arrangement which imparts an upward bias onto switch mechanism 74A (or any other engageable part of key assembly 70A). Housing 96A provides structural support to elements relating to key assembly 70A, without unduly restricting movement of its elements described herein.

It will be appreciated that in other embodiments, the dimensions and shapes of the elements of another key assembly may be modified to meet any design, functional, aesthetic or structural requirements.

In use, as a user makes a downward stroke on a key assembly until he believes that the key has been activated then releases the key. In the downward stroke, relatively constant downward pressure is imparted on the selected key assembly by the user's finger. As pressure is imparted on key assembly 70A, key cap 72A moves downward in the direction of arrow 84. With the net frictional forces designed amongst the units, key cap 72A, key plunger 76A and switch mechanism 74A initially move as a unit downward. As the key assembly 70 is further depressed, biasing spring 78A compresses and imparts an upward resistance to the downward force.

For the pre-select function, as key assembly 70A is pressed downward, sensor 86A on switch mechanism 74A passes by contact point A, noted as reference 88A. The contact point may be set to be very early in the downward stroke for key assembly 70A. In one embodiment, the pre-select position may be the point where a finger is simply lightly pressing on a key. This initial contact point completes an electrical signal between contact point A and sensor 86A, thereby allowing an appropriate signal may be generated by device 4. (This can be viewed as a first activation condition for the activation mechanism.) This signal can be used as a pre-select signal where pre-defined functionality is assigned to a key pressed in this "half engaged" position indicated by point A. By enabling the user to pre-select or highlight a desired key provides an improved key reliability and typing accuracy. Pre-selection feedback to the user may be provided in several forms. For example, initially touching the key may display on the text representing what character is about to be selected. This can be achieved with a software routine provided in the device linking the detected pre-select state of a key with the generation of a specific message or character on the display to indicate the pre-selection of the key. Alternatively, the device may provide audible, acoustic feedback to the user through feedback device 48 to indicate to the user what key they have begun to select. Alternatively still, the device may provide a tactile feedback, such as a Braille-like sensation to the user. It will be appreciated that during the pre-select stage, the command associated with the key has not yet been activated.

For the select function, as the key is further depressed, switch mechanism 74A passes through contact point A and sensor 86A disengages with contact point A. Then, switch mechanism 74A and sensor 86A move further downward and eventually passes contact point B which is noted at reference point 90. At point B, another circuit can be closed. Point B may indicate a second engagement, (e.g. a select function) signal for the key. For example, when switch mechanism 74A triggers a circuit to be closed with point B, device 4 may then generate on display 12 a character associated with the key. (This can be viewed as a second activation condition for the activation mechanism.) It will be appreciated that in other embodiments, contact points 88 and 90 may be spaced closer or further apart to lengthen or shorten the gap between activation in a pre-select stage and a select stage. Further, the contact points individually may be of varying lengths. For example, contact point 88 may have a longer contact area for sensor 86 compared with contact point 90, thereby providing a longer pre-select activation time compared with a select activation time, as the key is depressed.

In the embodiment, as the key is being depressed and prior to switch mechanism 74A passing point B, dome region in key cap 72A has retained its general convex shape. However, as key assembly 70A is further pressed downward past point B. biasing spring 78A becomes more completely compressed and imparts sufficient upward resistive force to the keystroke to resist the downward pressure of the keystroke. At this point, the top portion of key cap 72A begins to flex inward. Eventually, the top portion of key assembly 70A deflects downward towards the top portion of key plunger 76A and compressing air gap 82A. This deflection of key cap 72A happens relatively quickly and produces a "clicking" sound as it is deformed downward.

As key cap 72A deflects inward, air gap 82A collapses and air in air gap 82A is forced out downward through key plunger 76A through conduits 92A. Conduits 92A are full bore holes from the top of key plunger 76A passing through its interior channel to the bottom of key plunger 76A to underneath key cap 72A. As such, air can be expelled travel from air gap 82A through conduits 92A, as shown by the direction arrows 94A.

When the user lifts his finger from the key, as the top portion of key cap 72A is shaped and biased to he normally convex, and as the material of key cap 72A is resilient, the top portion of key cap 72A snaps back into its original convex shape. During this time, air can re-enter air gap 82A in a direction through a path in the opposite direction of arrows 94A.

Figure 3B:
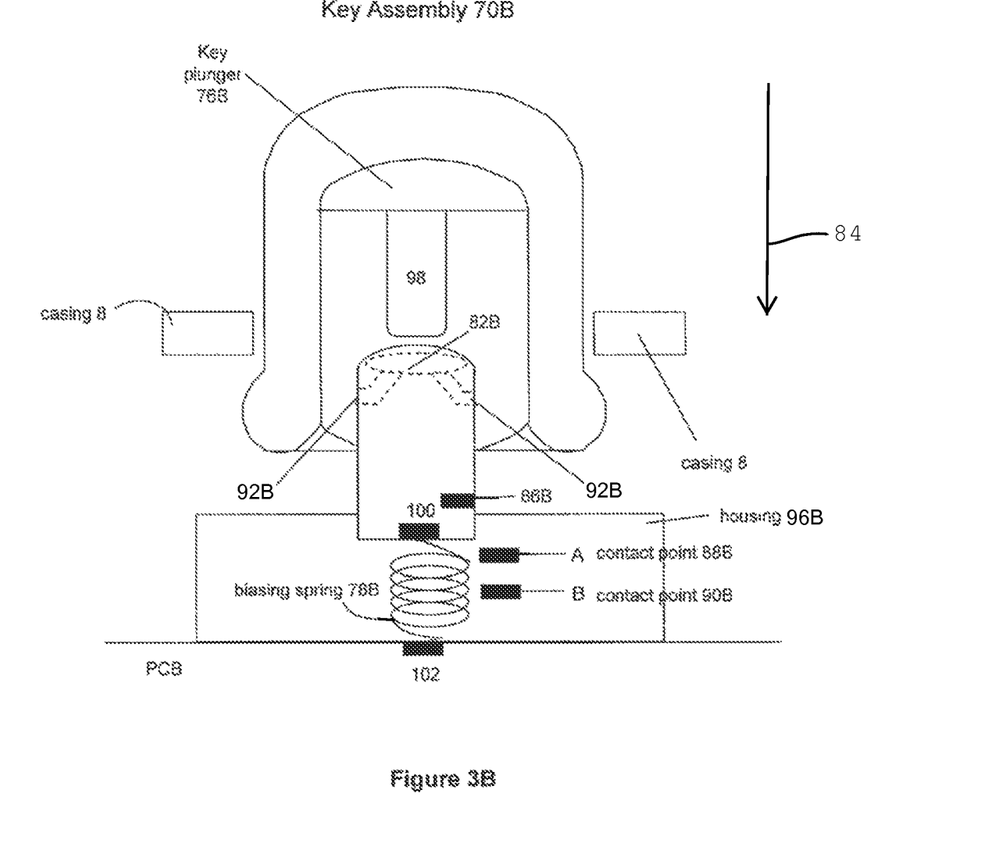
FIG. 3B is a side cross-sectional view of another embodiment of a keypad assembly which may be implemented in the device of FIG. 1.

Referring to FIG. 3B, for a second embodiment, a second key assembly 70B arrangement is shown. Where elements in FIG. 4B are similar to elements in FIG. 4A, the same reference numbers are used, but with a "B" suffix attached thereto. In some instances although the elements are similar between embodiments shown in FIGS. 4A and 4B, they may be in different locations.

In FIG. 3B, key assembly 70B includes the following elements: key cap 72B, switch mechanism 74B, key plunger 76B and biasing spring 78B. Key cap 72B is generally the shape of an hollow upright cylinder having an open end on its bottom. Key cap 72B is positioned within an opening in casing 8, with a lower portion extending into casing 8. Key cap 72B may have an exterior flange connected to its bottom edge to retain the lower portion within case 8. Key plunger 72B is dimensioned to fit snugly within key cap 72B. As such, in this embodiment, key plunger 72B is generally a cylinder. The top of key plunger 76B is generally flat in shape. Key plunger 76B has an additional stock 98 located at the bottom of key plunger 76B.

An air gap 82B is provided in switch mechanism 74B. The top surface of switch mechanism 74B is made of a thin and relatively flexible material such as a relatively thin plastic or metal. As key assembly 70B is pressed downward in the direction of arrow 84, the lower end of stock 98 engages with the top end of a convex dome on switch mechanism 74B. Vent holes 92B are located within switch mechanism 74B connecting air gap 82B with the exterior environment to switch mechanism 74B.

Switch mechanism 74B has a carbon puck 100 located on the bottom of switch mechanism 74B. A corresponding circuit 102 pad is located directly beneath puck 100 in the PCB. Biasing spring 78B provides an upwardly biased mechanism to bias key assembly 70B upward during the keystroke, but does not interfere with puck 100 contacting the circuit pad. As switch mechanism is pressed downward eventually, puck 100 contacts the circuit pad, thereby completing an electronic circuit. The completion of the circuit can be used to indicate that key assembly 70B is in a first position, such as the above noted pre-select position. In a variation on switch 74B, switch mechanism 74B can operate in a similar manner to switch mechanism 74A. In particular, switch mechanism 74B can be provided with contact point 86B thereon. Contact points 88B and 90B can be provided within housing 96B to provide two spaced contact points for contact point 86B.

In use, collapsing of the dome in switch assembly 74B indicates a second switch position and occurs after the engagement of the first switch position. This may be done by selecting appropriate bias forces for bias spring 78B (through choice of materials and spring design) and designing compression characteristics for the dome (again, through choice of materials, thickness of walls, shape of dome, etc). In another embodiment, the dome may be designed to collapse first, providing the pre-select position.

In other embodiments, a collapsible dome may be provided as a separate element or integrated into an existing element in a key assembly. The dome may be shaped as any collapsible form which compresses and decompresses by a downward keystroke and its subsequent release. As such, for example, in other embodiments, a dome may be located on a side of a channel of an element in the key assembly and extends laterally into the channel. In use, dome compresses and decompresses as the element passes long the dome. In other embodiments, the dome may be of any shape or material which allows compression and decompression.

Figure 3C:
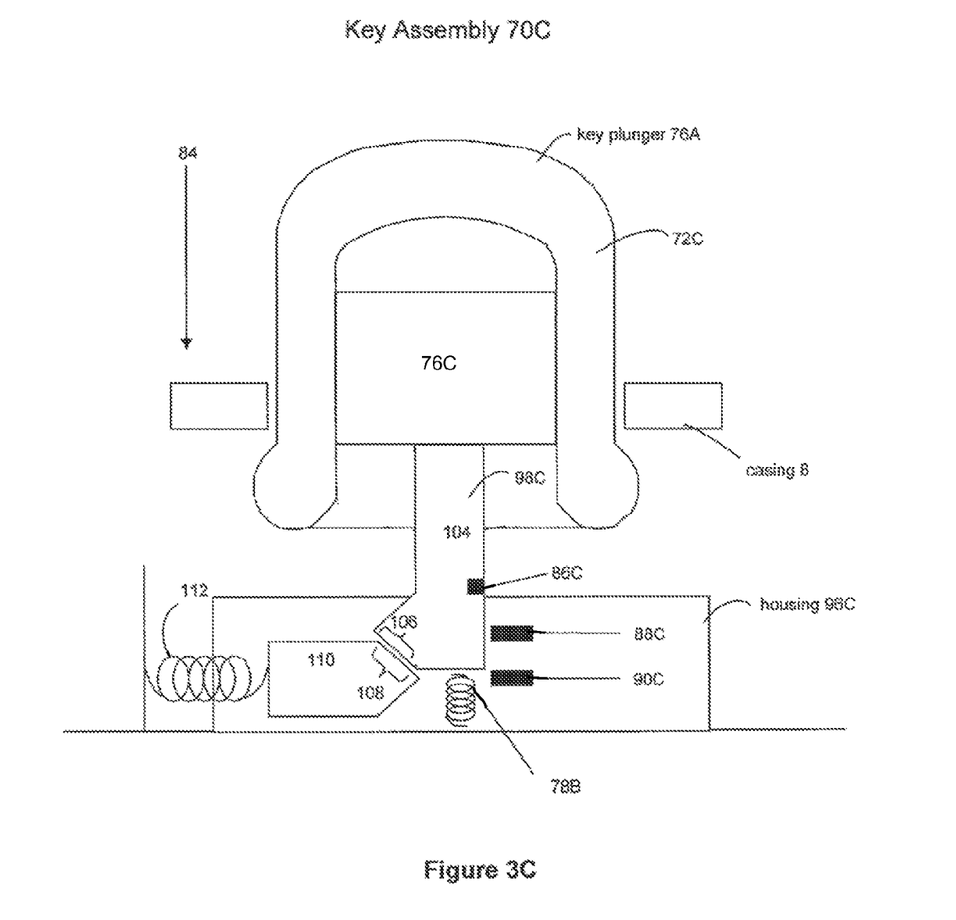
FIG. 3C is a side cross-sectional view of yet another embodiment of a keypad assembly which may be implemented in the device of FIG. 1.

Referring to FIG. 3C, another embodiment is shown as key assembly 70C. Therein, instead of a downward deflection of an air gap as shown in FIGS. 3A and B, a sideways deflection of interacting elements provides a definitive "detente" feedback to the user. As stock 98C of key plunger 76C has a shaped cam 104 at the bottom thereof. Near the bottom of the final travel distance of key assembly 70C, cam assembly 102 is located to one side of key assembly 70C. A lower surface 106 of cam 104 is engageable with an upper surface 108 of cam assembly 110. As key assembly 70C is pushed downward in direction arrow 84, surfaces 106 and 108 engage with each other and one or both of cams 110 and/or stock 98C are deflected away laterally from each other. Once the engagement upper surfaces of the two cams pass their initial deflection point, then stock 98C snaps laterally back to its lateral resting position. This "snap back" re-deflection is detected by activation sensor 46. Biasing spring 112 biases cam 110 laterally against stock 98C. Biasing member 78B upwardly biases key assembly 70C as it is forced downward. Other contact points 86C, 88C and 90C operate as described above in the related prior embodiments described above.

It will be appreciated that in embodiments shown generally in FIGS. 3A, 3B and 3C, switch assemblies 74 provide an activation system to detect first and second activation positions for a key assembly. A first feedback system is activated when the first activation position is engaged and provides a separate feedback sense to the user, (e.g. a "buzz" of a vibration module). A second feedback system provides a second feedback signal to the user when the key assembly has actuated its associated function (e.g. the "click" of the dome) at the second activation position. The second feedback system may operate independently of the activation of the switch assembly into its second position. For example, in FIG. 3A, the collapse of the dome may operate independently of the activation of the switch in position B. In different embodiments, the dome may be configured to collapse at different points other than at around the time when switch is in position B.

Figure 4:
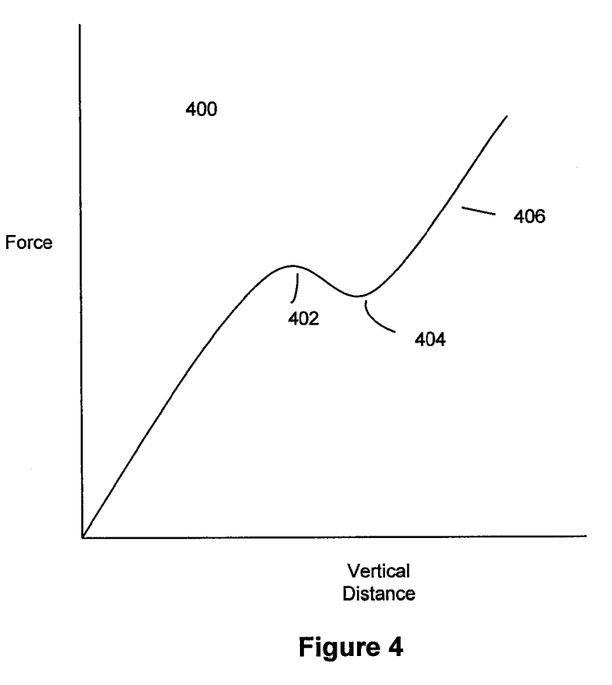
FIG. 4 is a graph illustrating a force versus vertical distance relationship for downward force exerted on a key as it is depressed through its vertical travelling distance of an embodiment implemented in FIG. 1.

Referring to FIG. 4, graph 400 illustrates a representative force imparted by the user on a key assembly of an embodiment is shown as a user presses on the key assembly. Graph 400 is a generally upwardly trending curve having a peak at point 402 and a subsequent valley at point 404. Peak 402 indicates an initial peak in force being applied to a key assembly in the embodiment (such as key assemblies 70A or 70B), and show the reflexing force provided as the corresponding dome (in either cap 72A or switch mechanism 74B) begins to collapse. As the dome is flexed inward and compresses against air gap (either gap 82A or 82B), the force being applied to the switch mechanism is offset by the deflection of the air gap (shown by valley 404). Subsequently, the dome fully compresses and the there is no more offset of force, leading to the increase in pressure applied to the switch mechanism at region 406 in curve 400.

Figure 5:
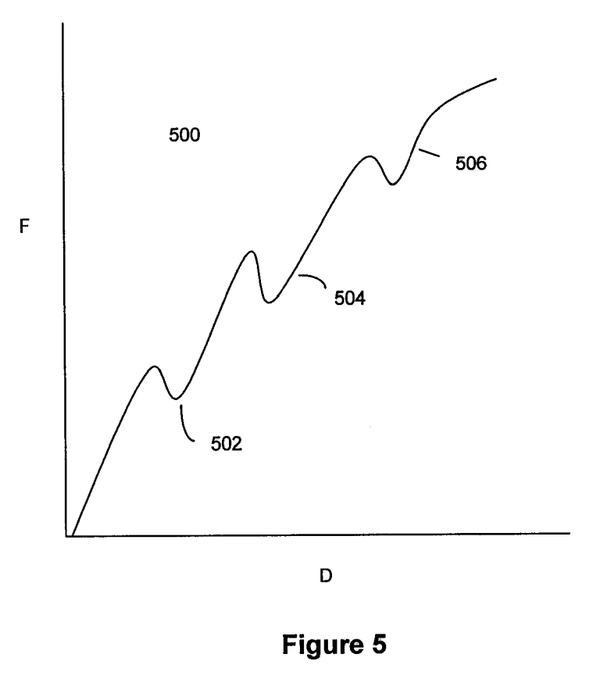
FIG. 5 is a graph illustrating another force versus vertical distance relationship for downward force exerted on a key as it is depressed through its vertical travelling distance for another embodiment implemented in FIG. 1.

In another embodiment, another feedback system provides multiple levels of feedback. For example, as a key is being depressed, when a key is determined to be in either a preselect or fully select state, a specific feedback signal is generated. The device may also monitor for how long a key is being pressed and provide different feedback signals as the duration increases. Further still, pre-select, select and post-select feedback signals may be provided. FIG. 5 shows a representative force and distance graph 500 for different force points 502, 504 and 506 as a key is being depressed with generally increasing force. It will be appreciated that these forces points are similar to the transitions shown in FIG. 4.

Depending on how feedback device 48 is selected and implemented, several different types of feedback may be provided. In one embodiment, upon pre-selection of a given key, a moderate feedback signal is provided by feedback device 48. Upon full engagement of the key, a stronger feedback signal is provided. For example, if the feedback device 48 is a vibration module, and the device recognizes that a key is being pre-selected, the controlling software causes the feedback device to generate a moderately intense "buzz" or a "buzz" of a relatively short duration. When the device recognizes that the key is being fully engaged, the feedback device is set to generate a more intense or a longer lasting "buzz"; when the device recognizes that the key is still being held in a "post-select" mode, the feedback device is set to generate an even longer "buzz".

In other embodiments, different types of feedback can be used for a key depending on the context of a key's current use. For example, the key can have several characters associated with it depending on the current operating mode of the device. Depending on the mode of the device, a value for the key may be set to represent a lowercase character, an uppercase character, a (single-digit) number or a special character. All operating modes are set by software operating on the device. The feedback generated may differ for each value associated with the key. For example, if the device has a full keypad with a certain set of keys representing both characters and numbers, when the device is placed in a "number-only" key pad mode, different is provided provide to distinguish when a user is about to press a number key as opposed to a character key. As such, a stronger feedback signal is generated for a key having a number value as opposed to its neighbouring keys having a character value.

As another example, when device 4 requests confirmation from the user to perform a certain function (e.g. "Delete a record"), device 4 displays a confirmation message on its screen and asks the user to enter a single character "Y/N" acknowledgement answer. A stronger level of feedback can be provided for the "Y" character key instead of the "N" character key, or vice versa.

Turning now to the third section, details are provided on centralized keypad systems. Referring to FIG. 3A, while the physical structure of key assembly 70A is maintained, activation of key assembly 70A is provided by a centrally located activation sensor 46. Such sensor can be an accelerometer. In a further variation, the collapse point of air gap 80A under key cap 72A may be adjusted via selection of materials or design or relevant collapsing regions of key cap 72A to collapse at an early or later stage in the keystroke. Further, as air gap 80A collapses, the subsequent movement of air through conduits 92A may be detected by sensor 46. As an example, such air movements may be detected by an accelerometer or a microphone.

In another embodiment, a different central key system may be used. In particular, as a key assembly is pressed downward, a distinct movement, vibration or audible signal is produced through the interaction of its mechanical elements. Each key in the keypad, due to its particular location or structure produces at least one distinctive signal which is distinguishable from all other signals produced by any other keys. These signals may be microphonic, but are detectable by activation sensor 46. The motion sensor may be, without limitation, an accelerometer, a strain gauge, a piezoelectric circuit, a touchscreen, light sensor or a microphone. In these embodiments, detection of an activation of a key is achieved through the detection mechanism associated with the sensor. For example, activation could be achieved through detection of disruption of a signal field in the touchscreen, disruption of a light signal for a light sensor by a finger, detected pressure applied to a piezoelectric sensor, etc. Such movements may also be detected by sensors as described earlier.

Each type of sensor may have different sensitivities which affect how each sensor detects keystrokes. For example an accelerometer may be able to detect when a key in a keypad is pressed from the movement signature generated, but it may not be able to detect which key in the key pad was pressed as the movement signatures for the different keys are not distinct enough for the accelerometer to distinguish among them. Software operating on device 8 can be provided to identify signals received from various input sources for a key (e.g. the detection systems for pre-select, select and post-selection conditions) to identify what key has been activated. For example, consider a key where a contacts 86 and 88 (FIG. 3C) are provided to detect a pre-select condition and a central activation sensor (such as an accelerometer) is used to detect the select condition. However, the accelerometer cannot identify which key has been selected. When the key is pressed to the pre-select condition, the software identifies the key using the signals from contacts 86 and 88. When the key is pressed to the select condition, the software identifies that a key has been selected using signals from the accelerometer. However, to identify the specific key, the software makes a correlation to the previously detected pre-select key to infer which key has been selected. It will be appreciated that the software can follow this or functionally equivalent algorithms using programming techniques known in the art.

The motion sensor may be implemented as a single sensor of one type, multiple sensors of the same type, or multiple sensors of different types. Software operating on device 4 receives signals from the activation sensor 46 and identifies which key assembly is being pressed and whether the key assembly is being "pre-selected", "selected" or "post selected" (as described above).

Other key assembly systems may be used. For example, a key assembly may be implemented as a simple leaf spring (or dome). A key is associated with a dome, but electrical contacts do not need to be associated with the compression of the dome. As the dome is compressed by the user, an activation sensor 46 detects the compression of the dome (either with a pre-select force or a full force).

Figure 6:
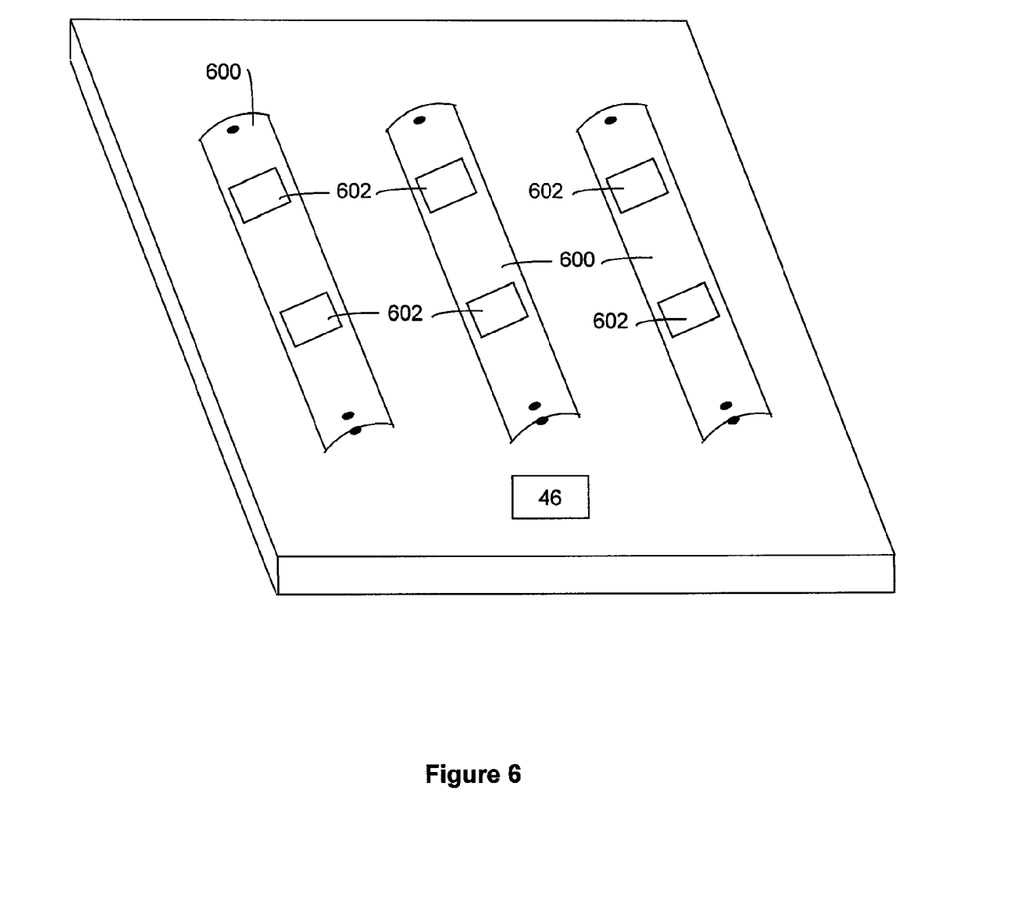
FIG. 6 is a top perspective view of a schematic of another keypad assembly associated with another embodiment implemented in FIG. 1.

Referring to FIG. 6, in another embodiment, a leaf spring 600 may be arranged to be convex to the PCB in device 4 with one or both ends secured to the PCB. Several individual keys 602 may be located along individual points in the leaf spring in a spaced relationship to each other. In use different amounts of pressure will be required to different keys along the leaf spring. These different amounts of pressure are detected by the activation sensor 46 to determine which key is being pressed and how forcefully it is being pressed. In yet another embodiment, a longitudinal strip of compressible and flexible material is provided with a cross-sectional convex bulge running along the strip. Several key may be located along the strip. Variations on the leaf spring 600 may include having a lattice network of leaf springs to identify row and column coordinates for keys located at intersection points in the lattice network. Alternatively, a set of rows (or columns) may be implemented by a set of leaf springs and the corresponding columns (or rows) may be implemented using other sensors, such as light sensors, pressure sensors or the like.

The present disclosure is defined by the claims appended hereto, with the foregoing description being merely illustrative of an embodiment of the disclosure. Those of ordinary skill may envisage certain modifications to the foregoing embodiments which, although not explicitly discussed herein, do not depart from the scope of the disclosure, as defined by the appended claims.

The invention claimed is:

1. A keypad assembly for use in an electronic device, comprising:
   a first key;
   an activation mechanism associated with the first key, the activation mechanism having at least a first activation condition and a second activation condition;
   a first feedback system associated with the activation mechanism providing a first feedback sense on the device; and
   a second feedback system providing a second feedback sense on the device, the second feedback sense indicating when the first key has triggered the second activation condition, the second feedback system, the second feedback system including:
      a first cam assembly coupled to the first key and is to move in a first direction when the first key is activated, an end of the first cam assembly having a first cam; and
      a second cam assembly positioned adjacent the first key, the second cam assembly having a second cam to move in a second direction non-parallel relative to the first direction when the first cam engages the second cam, wherein at least one of the first cam or the second cam is to deflect laterally away from the other one of the first cam or the second cam when the first cam engages the second cam.

2. The keypad assembly of claim 1, wherein the activation mechanism comprises a switch mechanism, an accelerometer, a piezoelectric circuit, a light sensor or a strain gauge.

3. The keypad assembly of claim 1, wherein the first feedback sensor comprises at least one of a motion signal, a visual signal, or an audible signal when the activation mechanism has triggered the first activation condition.

4. the keypad assembly of claim 1, wherein the first cam is to engage the second cam only along a portion of a travel stroke of the first key.

\* \* \* \* \*